(12) United States Patent
Yabugaki et al.

(10) Patent No.: US 10,983,324 B2
(45) Date of Patent: Apr. 20, 2021

(54) LIGHT DETECTING APPARATUS AND LASER-SCANNING MICROSCOPE

(71) Applicant: OLYMPUS CORPORATION, Hachioji (JP)

(72) Inventors: Hiroyuki Yabugaki, Tokyo (JP); Ryusuke Tanaka, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 16/177,119

(22) Filed: Oct. 31, 2018

(65) Prior Publication Data

US 2019/0137746 A1    May 9, 2019

(30) Foreign Application Priority Data

Nov. 7, 2017    (JP) .............................. JP2017-214296

(51) Int. Cl.
*G02B 21/00*    (2006.01)
*H03M 1/12*    (2006.01)
(Continued)

(52) U.S. Cl.
CPC ....... *G02B 21/0076* (2013.01); *G02B 21/008* (2013.01); *G02B 21/0084* (2013.01);
(Continued)

(58) Field of Classification Search
CPC ............... G01N 21/64; G01N 21/6402; G01N 21/6408; G01N 21/6454; G01N 21/6456; G01N 21/6458; G01N 21/6486
See application file for complete search history.

(56) References Cited

U.S. PATENT DOCUMENTS

| 6,094,627 A * | 7/2000 | Peck | ................... | G01N 30/8651 |
| | | | | 341/155 |
| 6,184,535 B1 * | 2/2001 | Kashima | ............ | G01N 21/6428 |
| | | | | 250/458.1 |

(Continued)

FOREIGN PATENT DOCUMENTS

| JP | 2001159734 A | 6/2001 |
| JP | 2013117529 A | 6/2013 |

OTHER PUBLICATIONS

Eibl et al. "Single pulse two photon fluorescence lifetime imaging (SP-FLIM) with MHZ pixel rate" Biomedical Optics Express vol. 8, No. 7, Jul. 1, 2017, p. 3132-3142. (Year: 2017).*

*Primary Examiner* — David P Porta
*Assistant Examiner* — Mamadou Faye
(74) *Attorney, Agent, or Firm* — Holtz, Holtz & Volek PC

(57) ABSTRACT

Provided is a light detecting apparatus including: a phase locked loop portion that generates a sampling clock based on a synchronization signal output from a light source that emits pulsed laser light; an A/D convertor that performs sampling of signal light output from a sample as a result of radiating the laser light thereon in accordance with the sampling clock; and a received-data processing portion that accommodates, every time N items of the sampling data are continuously acquired, the N items of data in a single data sequence. The phase locked loop portion is provided with a clock generating portion that generates a clock that has a frequency that is N times a pulse frequency of the laser light and that is synchronized with a phase of the laser light, and a delay adjusting portion that generates the sampling clock by adjusting a delay amount of the generated clock.

8 Claims, 12 Drawing Sheets

(51) Int. Cl.
*H03L 7/091* (2006.01)
*G01J 1/44* (2006.01)
(52) U.S. Cl.
CPC .......... *H03L 7/091* (2013.01); *H03M 1/1255* (2013.01); *G01J 1/44* (2013.01)

(56) References Cited

U.S. PATENT DOCUMENTS

| | | |
|---|---|---|
| 2001/0015411 A1 | 8/2001 | Ohdaira et al. |
| 2012/0268717 A1* | 10/2012 | Zhou .................... A61B 3/1015 351/221 |
| 2013/0140437 A1 | 6/2013 | Widzgowski |
| 2015/0028193 A1* | 1/2015 | Fujinuma ........... G02B 21/0084 250/214.1 |
| 2016/0103309 A1* | 4/2016 | Suzuki ................. G02B 27/145 359/388 |
| 2016/0198954 A1* | 7/2016 | Wang ................... A61B 5/0095 600/407 |

* cited by examiner

LIGHT DETECTING APPARATUS AND LASER-SCANNING MICROSCOPE

CROSS-REFERENCE TO RELATED APPLICATIONS

This application is based on Japanese Patent Application No. 2017-214296, the contents of which are incorporated herein by reference.

TECHNICAL FIELD

The present invention relates to a light detecting apparatus and a laser-scanning microscope.

BACKGROUND ART

There is a known laser-scanning microscope in which trigger signals are generated by using synchronization signals from a light source that emits pulsed laser light, and in which synchronization signals that indicate a timing and a period for sampling fluorescence with a predetermined cycle are generated (for example, see Japanese Unexamined Patent Application, Publication No. 2001-159734).

There is a known pulsed laser-scanning microscope that, by sampling both laser light and fluorescence at a frequency that greatly exceeds the pulsed oscillation frequency of the pulsed laser light, performs computation by using fluorescence data synchronized with the timing of excitation caused by the laser light (for example, see Japanese Unexamined Patent Application, Publication No. 2013-117529).

SUMMARY OF INVENTION

An object of the present invention is to provide a light detecting apparatus and a laser-scanning microscope with which it is possible to precisely detect a fluorescence signal while, by employing a low-cost A/D converter, achieving a cost reduction and reducing the amount of data processing and the storage volume.

An aspect of the present invention provides a light detecting apparatus including: a phase locked loop portion that is configured so as to generate a sampling clock on the basis of a synchronization signal output from a light source that emits pulsed laser light; an A/D converting portion that is configured so as to perform sampling of signal light output from a sample as a result of radiating the laser light thereon in accordance with the sampling clock output from the phase locked loop portion; and a received-data processing portion that is configured so as to accommodate, every time N items of the sampling data output from the A/D converting portion are continuously acquired, the N items of the data in a single data sequence. The phase locked loop portion is provided with: a clock generating portion that generates, on the basis of a phase locked loop, a clock that has a frequency that is N (N is an integer that is equal to or greater than 1) times a pulse frequency of the laser light and that is synchronized with a phase of the laser light; and a delay adjusting portion that is configured so as to generate the sampling clock by adjusting a delay amount of the clock generated by the clock generating portion.

In the above-described aspect, the delay amount may be set so that sampling is performed at a position at which a level of the signal light to be detected reaches a maximum.

In the above-described aspect, the received-data processing portion may be provided with a sequencing-start-trigger generating portion that is configured so as to generate a sequencing start trigger that indicates from which one of the sampling data among the sampling data that are successively output from the A/D converting portion sequencing of the data will be started.

In the above-described aspect, the sequencing-start-trigger generating portion may determine the timing of the sequencing start trigger by converting, to the number of sampling clocks, a delay difference between the time when the synchronization signal is output and the time when the laser light is transmitted to the A/D converting portion in the form of an analog signal after being reflected by the sample.

Another aspect of the present invention provides a laser-scanning microscope including: a scanning portion that is configured so as to two-dimensionally scan the laser light coming from the light source; an optical system that is configured so as to radiate the laser light scanned by the scanning portion onto the sample and that focuses the signal light generated in the sample; and any one of the above-described light detecting apparatuses that is configured so as to detect the signal light focused by the optical system.

DESCRIPTION OF EMBODIMENT

A light detecting apparatus 4 and a laser-scanning microscope 1 according to an embodiment of the present invention will be described below with reference to the drawings. In the following example, the configuration of a multi-photon excitation laser microscope that detects multi-photon excited fluorescence generated as a result of ultra-short pulsed laser light irradiation will be described as an example.

Figure 1:
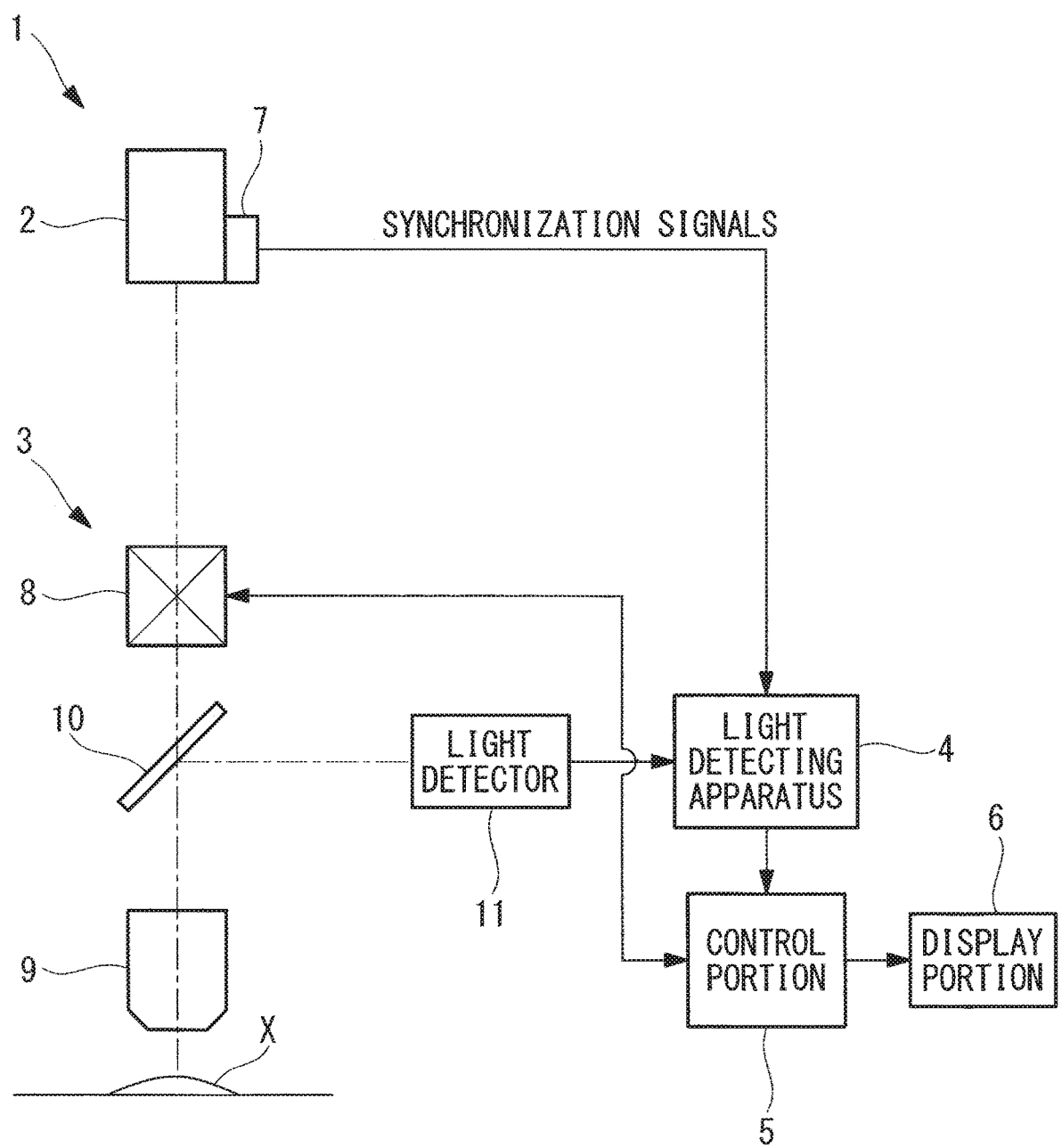
FIG. 1 is an overall configuration diagram showing a laser-scanning microscope according to an embodiment of the present invention.

As shown in FIG. 1, the laser-scanning microscope 1 according to this embodiment is provided with: a light source 2 that emits pulsed laser light; a microscope main body 3 that radiates the laser light coming from the light source 2 onto a sample X and that detects fluorescence (signal light) generated in the sample X; a light detecting apparatus 4 that generates digital fluorescence intensity signals by sampling the fluorescence detected by the microscope main body 3; a control portion 5 that controls the microscope main body 3 and that generates a fluorescence image by using the fluorescence intensity signals received from the light detecting apparatus 4; and a display portion 6 that displays the fluorescence image generated by the control portion 5.

The light source 2 is provided with a synchronization-signal outputting portion 7 that cyclically emits the pulsed laser light and that externally outputs synchronization signals for synchronizing with the emission cycle of the laser light.

The microscope main body 3 is provided with: a scanner (scanning portion) 8 that two-dimensionally scans the laser light coming from the light source 2; an objective lens (optical system) 9 that focuses the laser light scanned by the scanning portion 8 on the sample X, and that, on the other hand, focuses the fluorescence generated in the sample X; a dichroic mirror 10 that splits off the fluorescence focused by the objective lens 9 from the optical path of the laser light; and a light detector (for example, photomultiplier tube) 11 that detects the fluorescence that has been split off by the dichroic mirror 10.

The scanner 8 is, for example, a so-called proximity galvanometer mirror that is configured by disposing, so as to face each other, two galvanometer mirrors that are individually pivoted. The dichroic mirror 10 allows the laser light in a predetermined wavelength band to pass therethrough, and reflects the fluorescence in wavelength bands that are different from that of the laser light.

Figure 2:
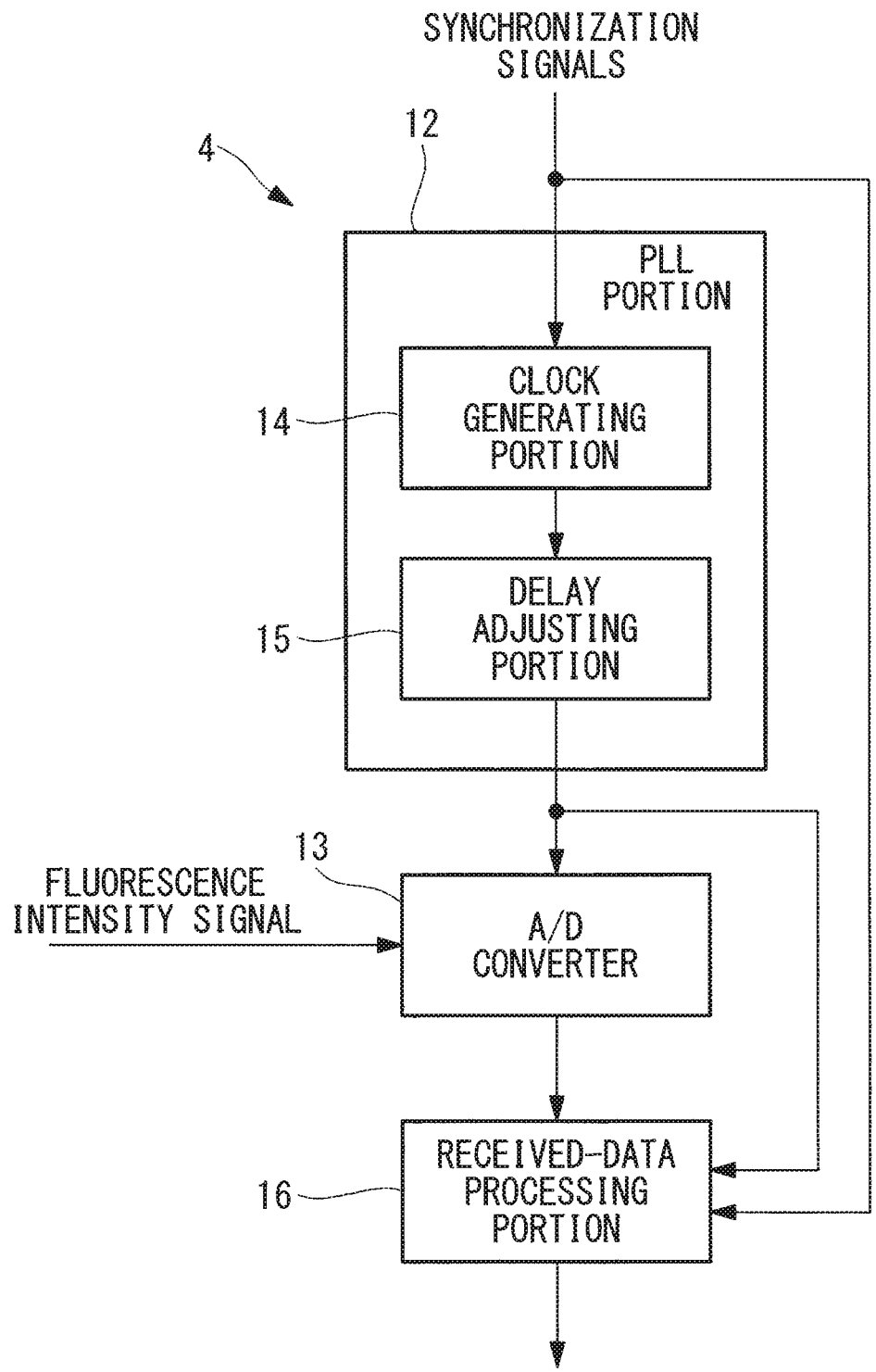
FIG. 2 is a block diagram showing a light detecting apparatus according to the embodiment of the present invention provided in the laser-scanning microscope in FIG. 1.

As show in FIG. 2, the light detecting apparatus 4 according to this embodiment is provided with: a PLL portion (phase locked loop portion) 12 that generates a sampling clock; and an A/D converter (A/D converting portion) 13 that performs sampling of the fluorescence detected by the light detector 11 by using the sampling clock generated by the PLL portion 12.

The PLL portion 12 is provided with a clock generating portion 14 and a delay adjusting portion 15.

By means of a phase locked loop, the clock generating portion 14 generates, on the basis of the synchronization signals output from the light source 2, a clock that has a frequency that is N (N is an integer that is equal to or greater than 1) times the pulse frequency of the laser light and that is synchronized with the emission cycle of the laser light.

The delay adjusting portion 15 generates a sampling clock by adjusting a first delay amount DT1 of the clock generated by the clock generating portion 14. The first delay amount DT1 will be described later.

The light detecting apparatus 4 is provided with a received-data processing portion 16 that accommodates, every time N items of the sampling data output from the A/D converter 13 are continuously acquired, the N items of the data in a single data sequence.

The control portion 5 generates a two-dimensional fluorescence image by associating scanning position information for driving the scanner 8 and the N items of the sampling data accommodated in the single data sequence.

The operations of the thus-configured light detecting apparatus 4 and laser-scanning microscope 1 according to this embodiment will be described below.

Figure 3:
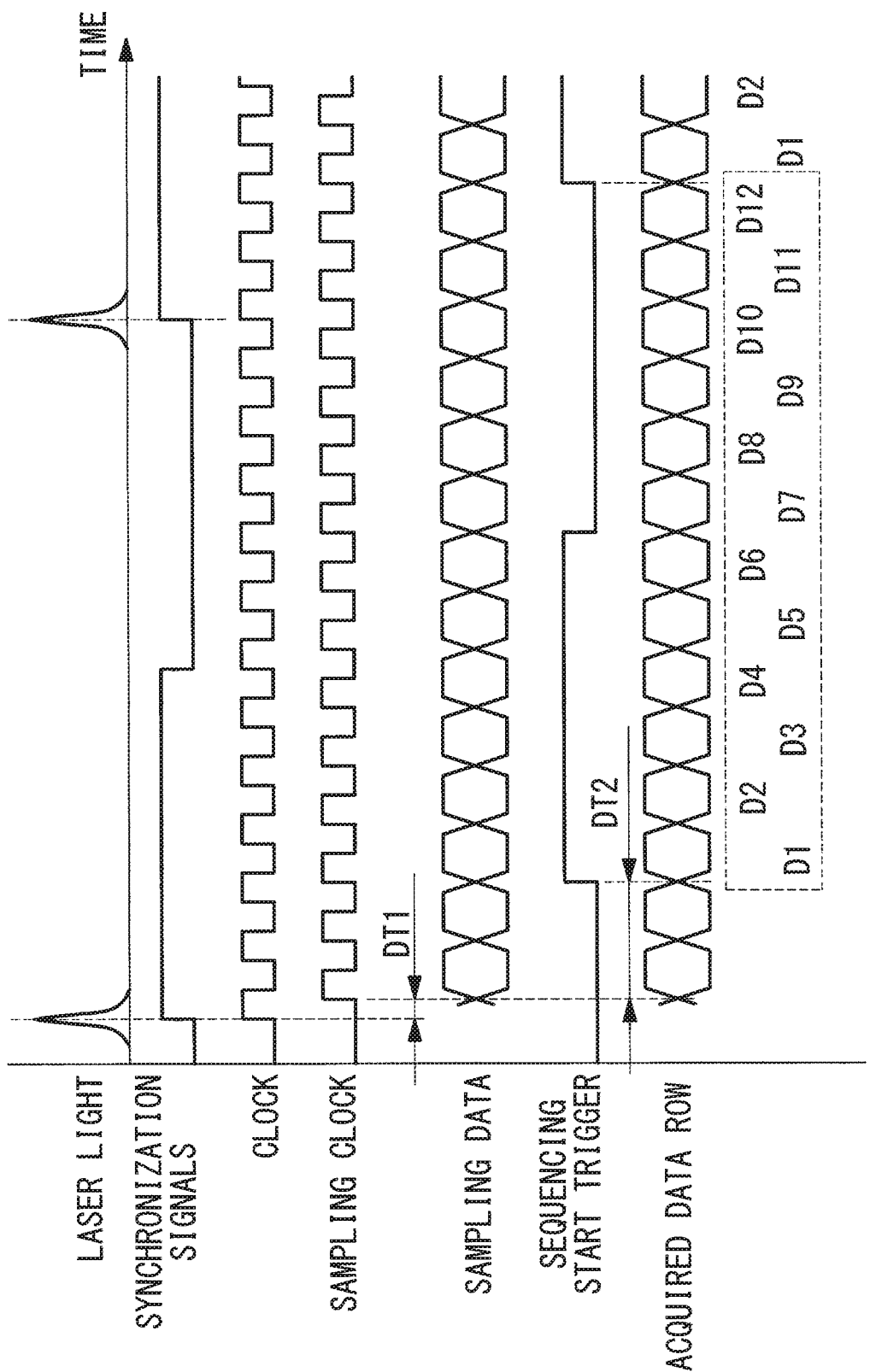
FIG. 3 is a timing chart for explaining the operation of the light detecting apparatus in FIG. 2.

As shown in FIG. 3, from the light source 2, the pulsed laser light is emitted in a predetermined cycle (pulsed laser oscillation cycle), and, from the synchronization-signal outputting portion 7 of the light source 2, the synchronization signals having the same cycle that is synchronized with the emission cycle of the pulsed laser light are output.

The pulsed laser light emitted from the light source 2 is two-dimensionally scanned by the scanner 8, and is focused on the sample X by the objective lens 9 after passing through the dichroic mirror 10. The laser light focused on the sample X generates fluorescence by exciting fluorescent substances that are present in the sample X at separate positions scanned by the scanner 8. The generated fluorescence is focused by the objective lens 9 and is detected by the light detector 11 after being split off from the laser light by the dichroic mirror 10.

In the light detecting apparatus 4, the analog signals indicating the fluorescence intensities output from the light detector 11 are input to the A/D converter 13. In the light detecting apparatus 4, the synchronization signals output from the synchronization-signal outputting portion 7 of the light source 2 are input to the PLL portion 12.

As a result of the synchronization signals being input to the PLL portion 12, the synchronization signals are input to the clock generating portion 14. As shown in FIG. 3, in the clock generating portion 14, on the basis of the input synchronization signals, a clock that has a frequency that is N-times the pulsed frequency of the pulsed laser light and in which the phase thereof is synchronized with the phase of the laser light is generated.

The clock generated in the clock generating portion 14 is input to the delay adjusting portion 15. In the delay adjusting portion 15, as a result of the first delay amount DT1 of the input clock being adjusted, a sampling clock is generated. Then, the generated sampling clock is input to the A/D converter 13, and thus, an analog signal of the fluorescence intensity is sampled at the beginning of each sampling clock.

By doing so, in the A/D converter 13, by means of the phase-adjusted sampling clock, A/D conversion of the fluorescence intensity is performed at a sampling rate that is N-times the frequency of the laser light.

Then, in the received-data processing portion 16, each set of N items of the A/D converted data is sequenced. By doing so, it is possible to generate a row of data detected in each cycle of the laser light.

A second delay amount DT2 in FIG. 3 will be described later.

As has been described above, with the light detecting apparatus 4 and the laser-scanning microscope 1 according to this embodiment, because the time cycle for acquiring N items of the sampling data of the fluorescence intensities and the cycle of the pulsed laser light completely coincide with each other, even if the emission cycle of the laser light fluctuates, sampling data that are synchronized with the fluctuation are acquired. Because of this, it is possible to maintain high temporal precision between the pulsed irradiation of the laser light and sampling, and thus, it is not necessary to optimize the sampling period.

With the light detecting apparatus 4 according to this embodiment, it is possible to acquire the sampling data at a cycle that is completely synchronized with the emission cycle of the laser light, and it is possible to prevent the occurrence of dead time at the boundaries in the cycle of the laser light. Thus, it is possible to keep jitter in each cycle very low. Because of this, there is an advantage in that the amount of time error is low even if the sampling frequency is reduced. By reducing the sampling frequency, it is possible to suppress heat generation in the employed A/D converter 13.

It is possible to perform sampling in which the amount of time error is low even if the sampling speed is reduced without using an expensive A/D converter having, for example, a 5-GHz sampling clock, as in an example in the related art. Because of this, there is an advantage in that it is possible to achieve a cost reduction.

As a result of the phase adjustment performed by the delay adjusting portion 15 of the PLL portion 12, there is an advantage in that it is possible to adjust the first delay amount DT1 between the pulse cycle of the laser light and the sampling cycle with a high degree of freedom and high precision. Specifically, in the laser-scanning microscope 1, between the time when the synchronization signals are output from the light source 2 and the time when the synchronization signals reach the PLL portion 12, a delay in the synchronized phase and a propagation delay of the synchronization signals may occur. Between the time when the laser light is emitted from the light source 2 and the time when the fluorescences generated in the sample X are detected by the light detector 11, a light propagation delay in accordance with the optical path length may occur. Between the time when the fluorescence intensity signals are output from the light detector 11 and the time when the fluorescence intensity signals reach the PLL portion 12, a propagation delay of the signal may occur.

In the delay adjusting portion 15, it is possible to set the first delay amount DT1 so as to cancel out these delays.

Figure 4:
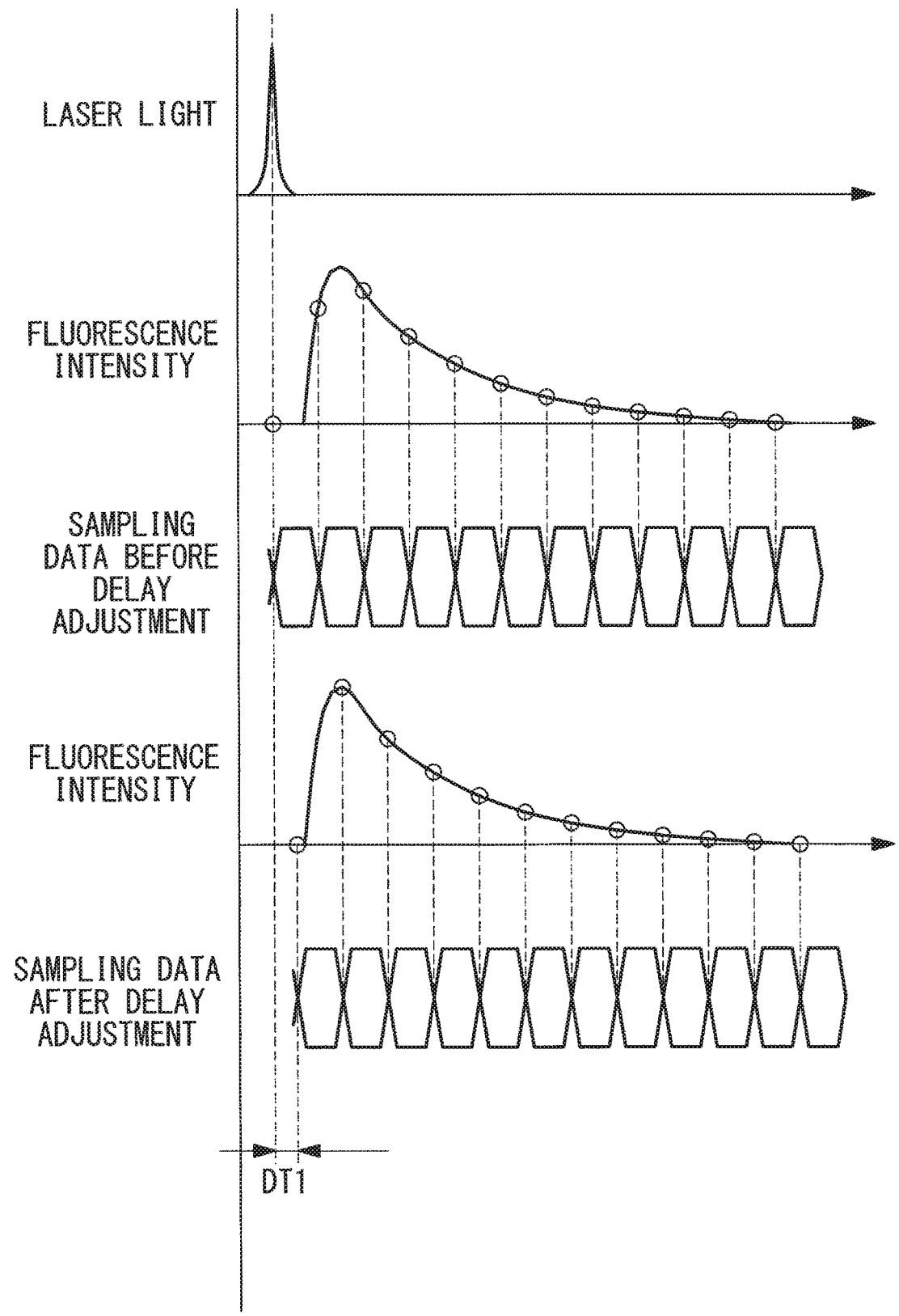
FIG. 4 is a diagram for explaining a method for setting a first delay amount that is adjusted in a delay adjusting portion in the light detecting apparatus in FIG. 2.

Regarding the first delay amount DT1 of the clock, which is adjusted in the delay adjusting portion 15, as shown in FIG. 4, the first delay amount DT1 may be automatically adjusted to a value at which it is possible to acquire a desired signal. For example, by finely fluctuating the first delay amount DT1, a first delay amount DT1 at which the signal level of the acquired sampling data reaches a maximum may be employed. Alternatively, by connecting a test-pattern generating apparatus (not shown) to the light detecting apparatus 4, setting may be performed on the basis of the input test pattern.

If it is possible to measure all of the delays, it is possible to set, in the received-data processing portion 16, the second delay amount DT2 with which it is determined from which one of the data items among the data successively input from the A/D converter 13 sequencing thereof will be started.

Figure 5:
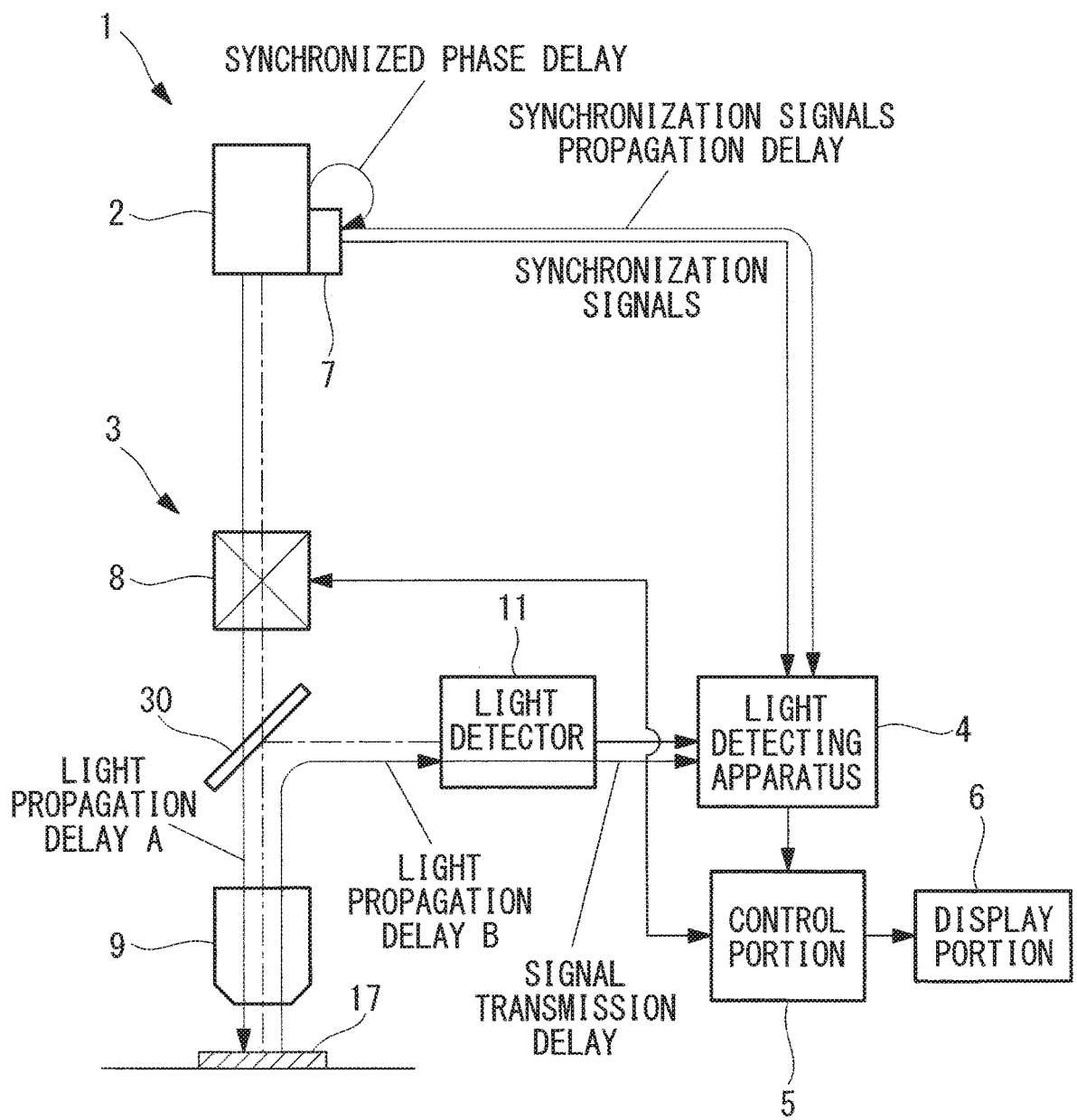
FIG. 5 is a diagram for explaining a method for setting the second delay amount in FIG. 3.

As a method for setting the second delay amount DT2, for example, as shown in FIG. 5, on a stage on which the sample X is disposed, a mirror 17 is disposed instead of the sample X so that the laser light emitted from the light source 2 is reflected by the mirror 17.

In this case, a half mirror 30 may be disposed instead of the dichroic mirror 10 so that at least a portion of the reflected light coming from the mirror 17 is made incident on the light detector 11.

By doing so, the laser light reflected by the mirror 17 is made incident on the light detector 11 and is output in the form of detection signals, thus being sampled by the A/D converter 13.

Figure 6:
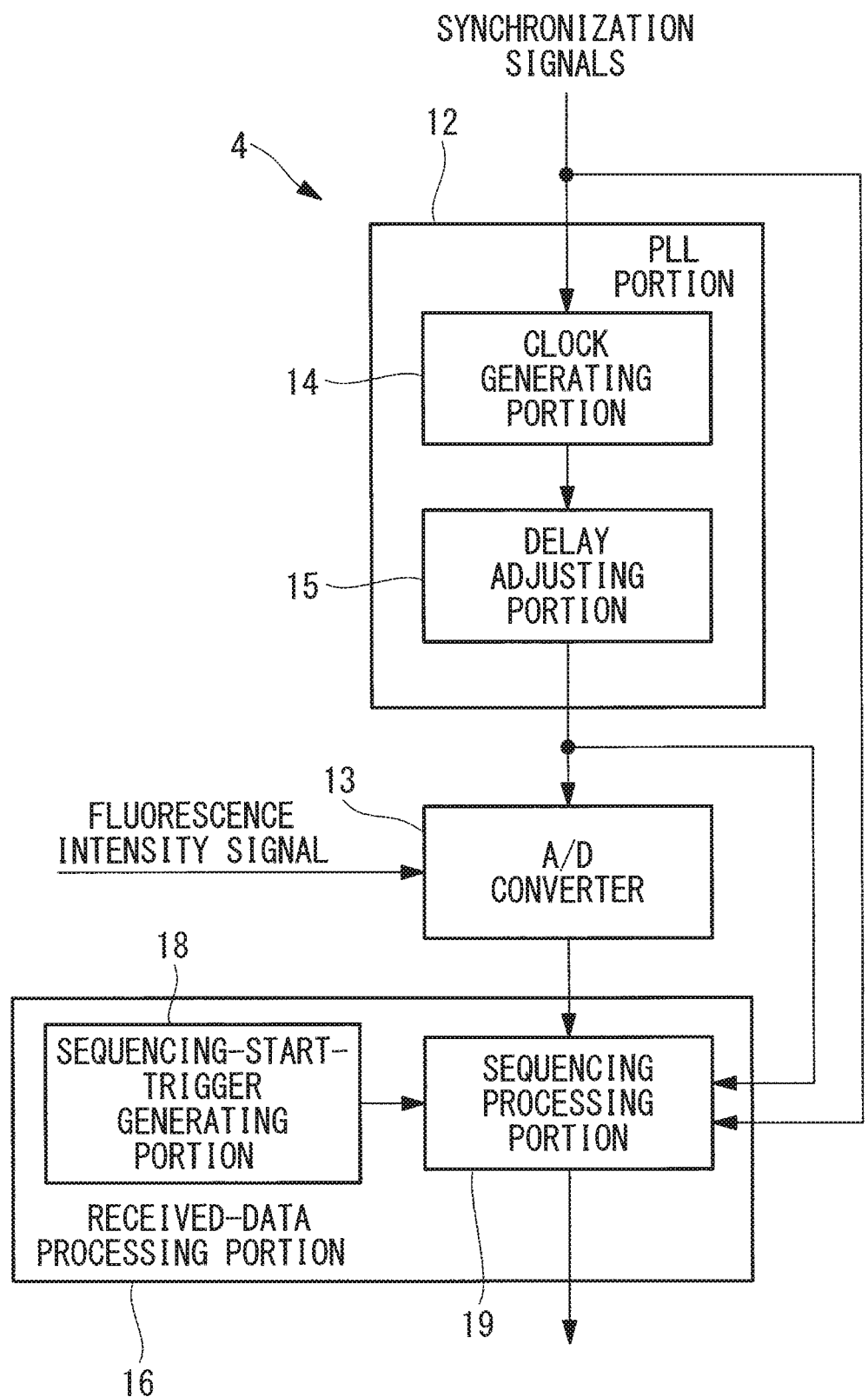
FIG. 6 is a diagram for explaining the details of the received-data processing portion in FIG. 3.

In this case, as shown in FIG. 6, the received-data processing portion 16 may be provided with: a sequencing-start-trigger generating portion 18 that detects, of the N data rows subjected to data conversion at the A/D converter 13, the ordinal number of data at which the light intensity signal of the laser light is sampled, that stores this data number as the second delay amount DT2, and that generates a sequencing start timing trigger; and a sequencing processing portion 19 that performs sequencing in accordance with the sequencing start timing trigger.

In the received-data processing portion 16, the sequencing-start-trigger generating portion 18 generates the sequencing start timing trigger at a timing that is delayed by an amount corresponding to the second delay amount DT2 with respect to the synchronization signal from the light source 2. Accordingly, the sequencing processing portion 19 starts sequencing. Here, the second delay amount DT2 is determined on the basis of the ordinal number of data at which the laser light is sampled after the beginning of the synchronization signals. For example, as shown in FIG. 3, the second delay amount DT2 is set so that a sampling data D1 of the acquired data row coincides with the timing at which the laser light reflected by the mirror 17 is sampled. After the second delay amount DT2 is set once, the mirror 17 is removed, the sample X is disposed in place instead of the mirror 17, and the dichroic mirror 10 is returned to the original position. By doing so, it is possible to sequence the sampling data by sampling the fluorescence coming from the sample X while canceling out the delay of the synchronization signals and the delay caused by the optical path length.

Figure 7:
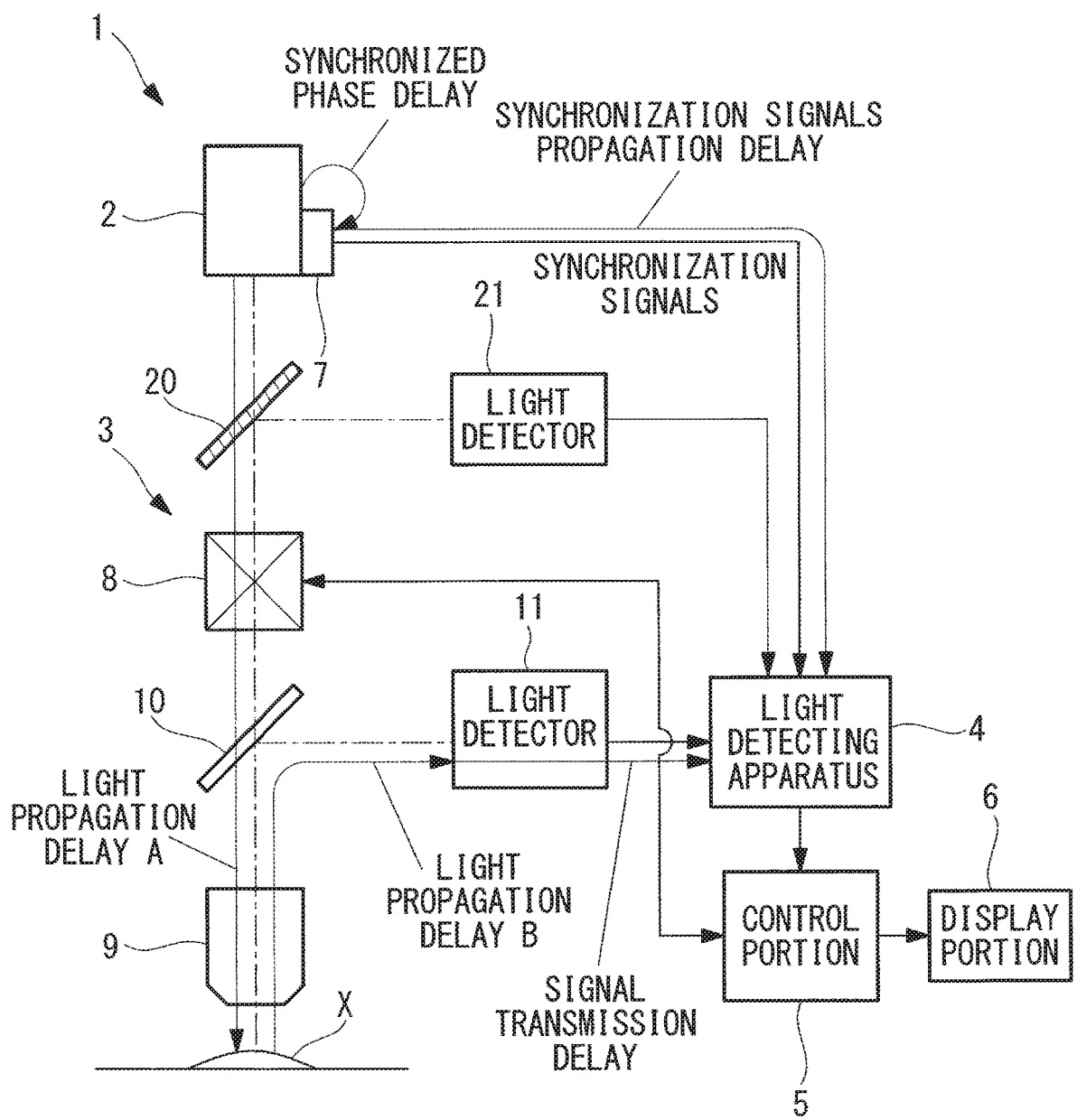
FIG. 7 is a diagram for explaining another method for setting the second delay amount in FIG. 3.

As another method for measuring the delays, as shown in FIG. 7, a half mirror 20 may be disposed between the light source 2 and the scanner 8, and the laser light split off by the half mirror 20 may be detected by another light detector 21 and input to the A/D converter 13. A time difference between timing at which the laser light that has been split off is input to the A/D converter 13 and the timing at which the synchronization signals from the light source 2 reach the A/D converter 13 is detected.

Here, this time difference is calculated on the basis of the ordinal number of the sampling cycle at which sampling is performed after the beginning of the synchronization signal. A value obtained by adding, to the calculated time difference, a delay amount in the difference between an optical-path propagation distance for reaching the light detector 11 via the half mirror 20, the sample X, and the dichroic mirror 10 and an optical-path propagation distance between the half mirror 20 and the other light detector 21 may be set in the received-data processing portion 16 as the delay amount DT2.

As another method for determining the second delay amount DT2, the received-data processing portion 16 receives the synchronization signals output from the light source 2, and theoretically calculates all of the electrical propagation delays of said synchronization signals, a time delay between the time when the laser light reaches the sample X and the time when the laser light reaches the A/D converter 13 by being detected by the light detector 11 via the dichroic mirror 10, etc. Then, the calculated delay amounts are set in the received-data processing portion 16, and sequencing may be started at a timing that is delayed by an amount corresponding to the second delay amount DT2 with respect to the received synchronization signals.

Figure 8:
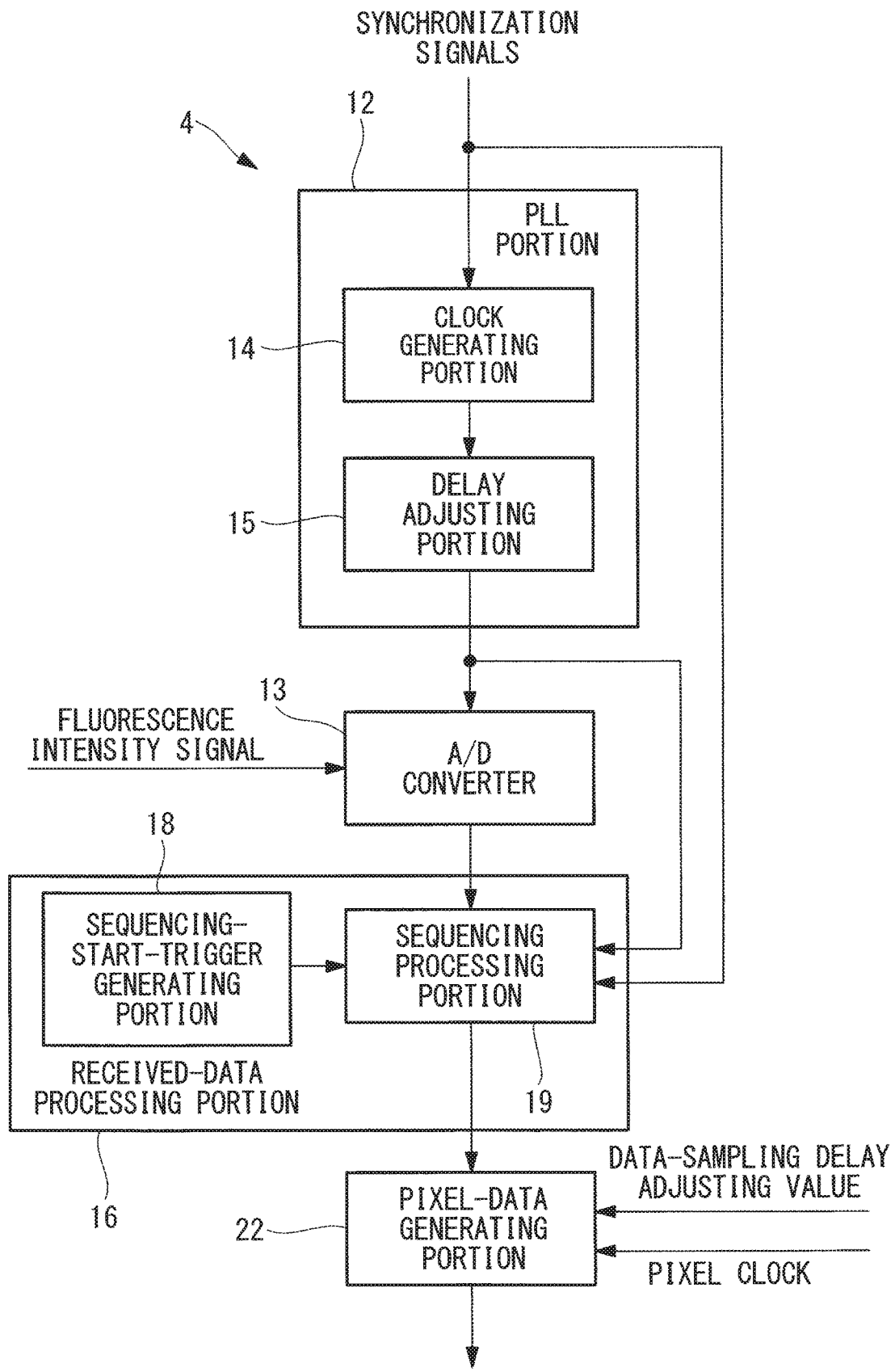
FIG. 8 is a block diagram for explaining a modification of the received-data processing portion in FIG. 3.
Figure 9:
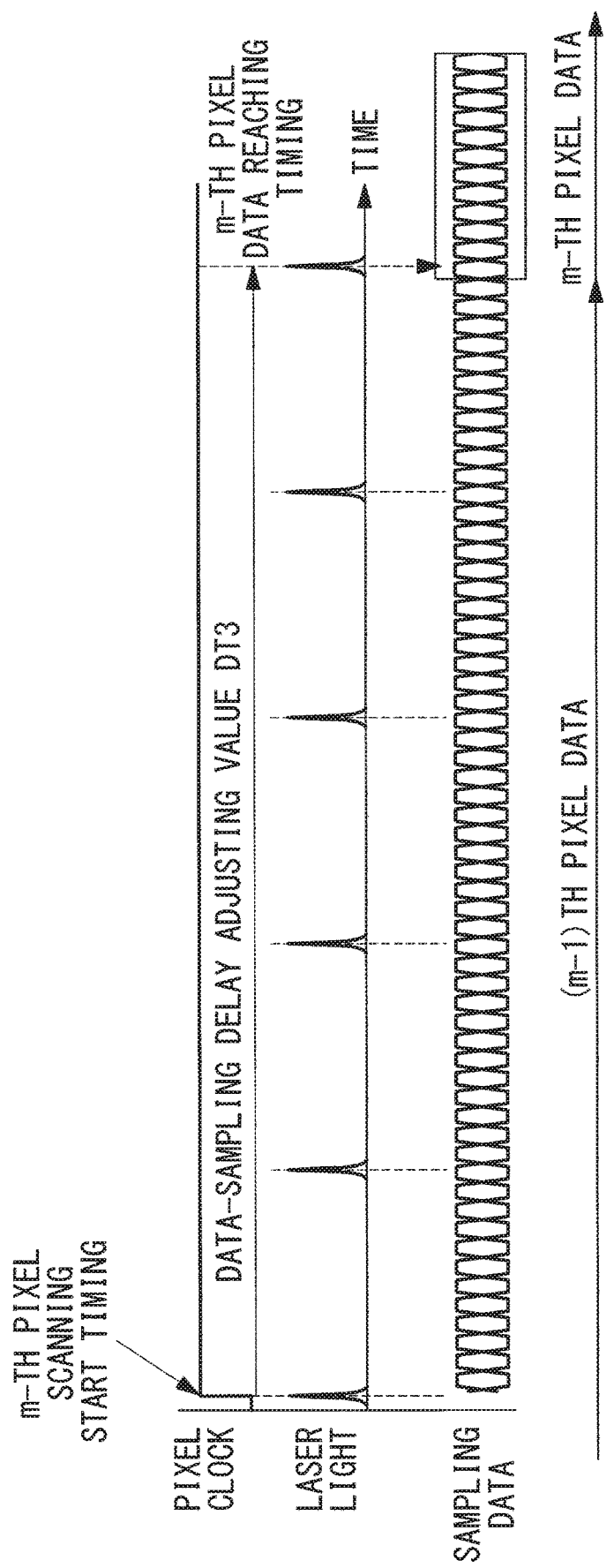
FIG. 9 is a diagram for explaining a third delay amount that is set by the received-data processing portion in FIG. 8.

As shown in FIG. 8, the laser-scanning microscope 1 according to this embodiment may be provided with a pixel-data generating portion 22 that starts pixel-data generation at a timing that is delayed by an amount corresponding to a third delay amount DT3 set to a data-sampling delay adjusting value with respect to a scanning start timing of a pixel clock. There are cases in which the time delays that occur in the A/D converter 13 and the received-data processing portion 16 are greater than the pulse cycle of the laser light, and a large time difference occurs between the time when the laser light is radiated toward the scanning pixel position and the time when resultant signal-light sampling data are output. In this case, as shown in FIG. 9, the output from the pixel-data generating portion 22 is delayed in the case in which there is a delay between a timing at which scanning of m-th pixel is started and a timing at which data of the m-th pixel arrives thereat in an amount that corresponds to the third delay amount DT3. By doing so, it is possible to absorb time delays in both the pixel clock and the sampling data to be input to the control portion 5.

Figure 10:
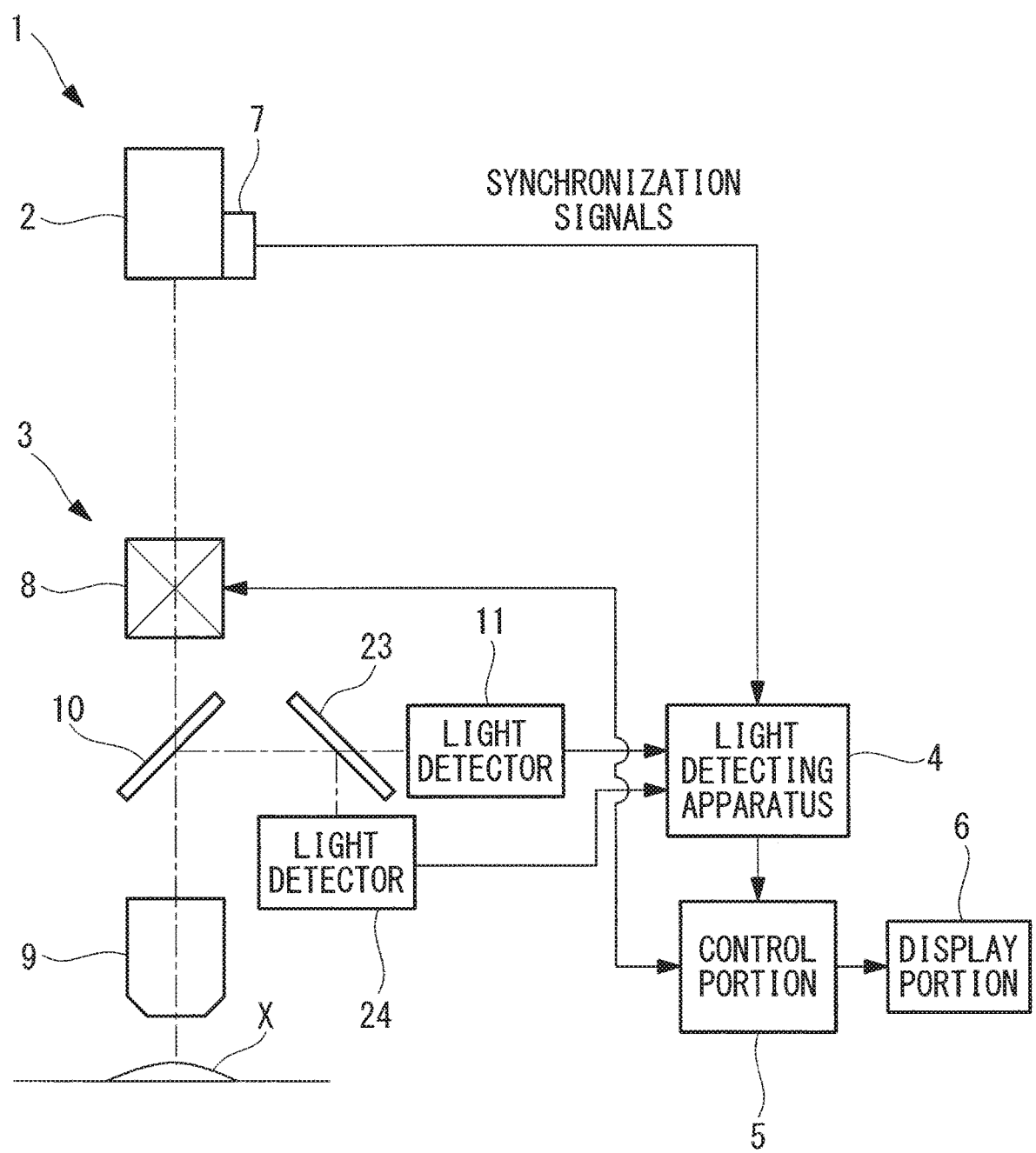
FIG. 10 is an overall configuration diagram showing a modification of the laser-scanning microscope in FIG. 1.

Although the case in which fluorescence is detected by the single light detector 11 has been described as an example, alternatively, as shown in FIG. 10, a dichroic mirror 23 that splits off fluorescence in accordance with the wavelength may be additionally provided, and a plurality of light detectors 24 that separately detect the split fluorescence may be provided. In this case, differences in the optical path lengths for reaching the individual light detectors 11 and 24, differences in electrical delays between the individual light detectors 11 and 24 and the A/D converter 13, and differences in delays due to processing delays and detection delays between individual channels of the A/D converter 13 may be set, as the second delay amounts DT2, in the received-data processing portion 16 for the separate channels. Any one of the above-described methods may be employed as a method for setting the delay amounts for the separate channels.

As a microscope application, there is a method known as a gate method in which, after the individual pulses of the laser light are emitted, only fluorescence signals detected in specific time segments (gate segments) are extracted. In order to generate the pixel data, a single pixel data item is generated by using multiple fluorescence signals obtained via the multiple pulses of the laser light. Because of this, in order to execute the gate method, it is necessary to extract sampling data in the specific time segments in the plurality of fluorescence signals.

Figure 11:
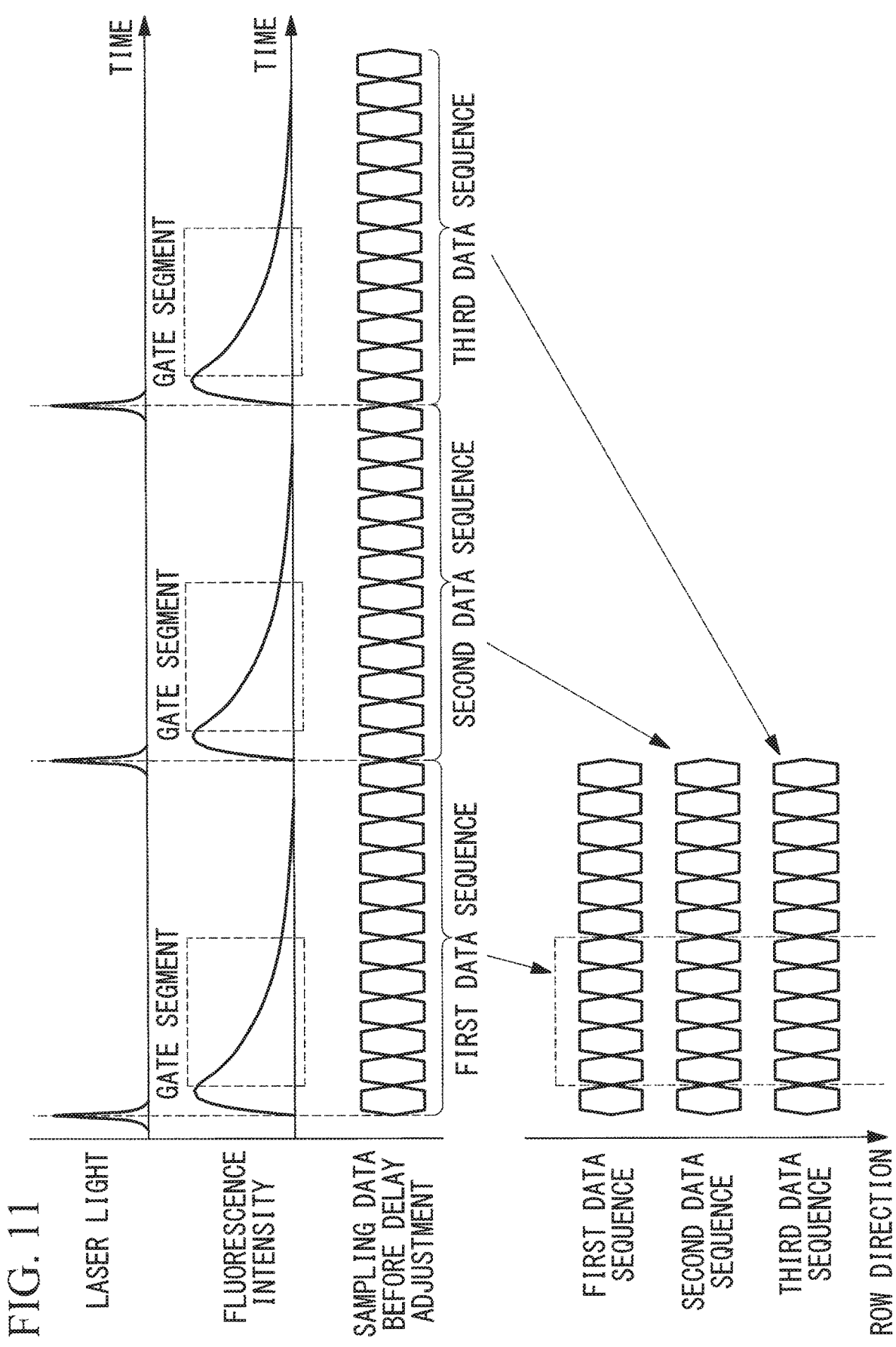
FIG. 11 is a block diagram for explaining another modification of the received-data processing portion in FIG. 3.

Therefore, as shown in FIG. 11, two-dimensional sequence processing, in which the sequenced data that have been successively sequenced by the received-data processing portion 16 are used as elements (column elements), may be executed, and N data sequences corresponding to the individual pulses of the laser light may be successively accommodated in the row direction. By two-dimensionally sequencing the thus-sampled fluorescence data, there is an advantage in that it is possible to easily perform data processing by extracting the fluorescence data in the time segments corresponding to the multiple pulses of the laser light.

Figure 12:
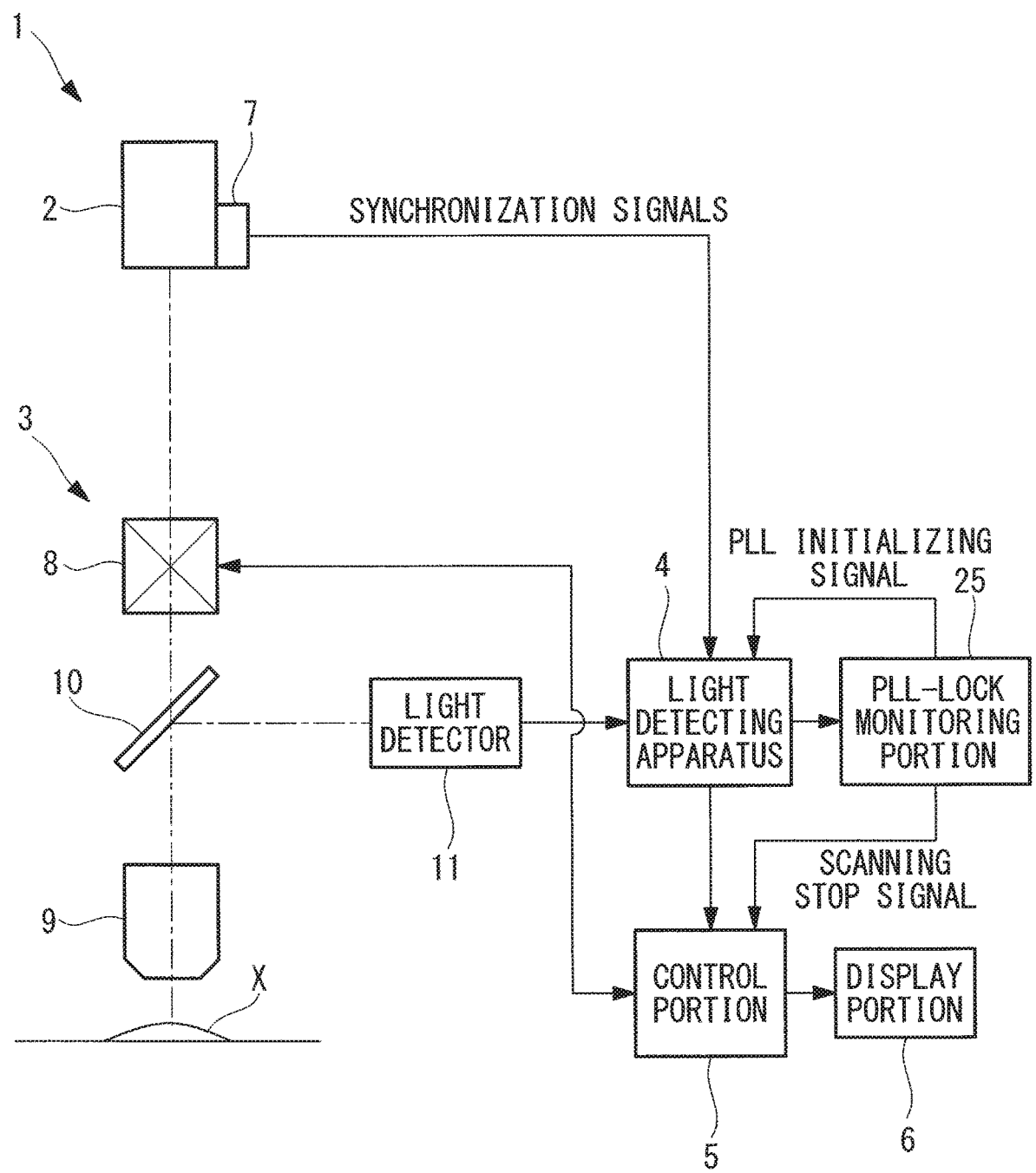
FIG. 12 is an overall configuration diagram showing another modification of the laser-scanning microscope in FIG. 1.

As shown in FIG. 12, the PLL portion 12 may be provided with a PLL-lock monitoring portion 25. The PLL-lock monitoring portion 25 may receive a PLL-lock signal from the PLL portion 12, may output a scanning stop signal to the control portion 5 in the case in which the synchronization with the synchronization signal received from the synchronization-signal outputting portion 7 is lost, and may cause the control portion 5 to perform scanning stop processing. At the same time, by transmitting a PLL initializing signal to the PLL portion 12 from the PLL-lock monitoring portion 25, the locked state of the PLL portion 12 is initialized. When the locked state in the PLL portion 12 is re-established, the PLL-lock monitoring portion 25 may cancel the scanning stop signal for the control portion 5, thus returning to a state in which scanning can be performed by the scanner 8.

Although a multi-photon excitation laser microscope has been described as an example of the laser-scanning microscope 1 of this embodiment, alternatively, the present invention may be applied to an ordinary laser confocal microscope.

In this case, there is a difference with respect to the case in which a multi-photon excitation laser microscope is employed in that the light detector 11 is disposed after a pinhole that is disposed at a position that is optically conjugate with the focal point of the objective lens 9. Regarding other points, the fluorescence detection is performed by using the configuration and signal processing that are the same as those in the case in which a multi-photon excitation laser microscope is employed.

Although a continuous oscillation laser is generally used as a light source in confocal observation instead of a pulsed oscillation laser, in special observation methods such as fluorescence lifetime imaging microscopy (FLIM), etc., there are cases in which continuous oscillation laser light is radiated onto the sample X after modulating the intensity thereof in a pulsed manner by using an arbitrary intensity modulating means, and in which signal detection is performed in a manner that is synchronized with the modulation pulse thereof. In this case, the synchronization signal for the pulse modulation signal to be imparted to the intensity modulating means may be input to the PLL portion 12 instead of the synchronization-signal outputting portion 7.

Although a case in which fluorescence is detected has been described as an example, alternatively, the present invention may be applied to a case in which another arbitrary signal light is detected. Examples include a stimulated Raman scattering microscope (SRS microscope) in which Raman scattered light generated by irradiating the sample X with the pulsed laser light coming from the light source 2 is observed. With an SRS microscope, in order to improve the S/N ratio of the detection signal, a cyclical intensity modulation is additionally applied to the pulsed laser light coming from the light source 2, and only frequency components of cyclical intensity modulation contained in analog signals from the light detector 11 are separated and extracted by using a lock-in amplifier, thus obtaining the target intensity data. Because a lock-in amplifier requires a relatively large amount of time until outputs thereof are stabilized, there is a disadvantage in that it is difficult to achieve a high-speed image frame rate. However, in this embodiment, by inputting the signal synchronized with the modulation signal in cyclical intensity modulation to the PLL portion 12, the resultant signal can be detected in the A/D converter 13 and the received-data processing portion 16 as digital data that are synchronized with the intensity modulation frequency thereof. By doing so, this method can be utilized to obtain signal data having a good S/N in a shorter amount of time as compared with the method employing a lock-in amplifier.

Consequently, the following aspects are derived from the above-described embodiment.

An aspect of the present invention provides a light detecting apparatus including: a phase locked loop portion that is configured so as to generate a sampling clock on the basis of a synchronization signal output from a light source that emits pulsed laser light; an A/D converting portion that is configured so as to perform sampling of signal light output from a sample as a result of radiating the laser light thereon in accordance with the sampling clock output from the phase locked loop portion; and a received-data processing portion that is configured so as to accommodate, every time N items of the sampling data output from the A/D converting portion are continuously acquired, the N items of the data in a single data sequence. The phase locked loop portion is provided with: a clock generating portion that generates, on the basis of a phase locked loop, a clock that has a frequency that is N (N is an integer that is equal to or greater than 1) times a pulse frequency of the laser light and that is synchronized with a phase of the laser light; and a delay adjusting portion that is configured so as to generate the sampling clock by adjusting a delay amount of the clock generated by the clock generating portion.

With this aspect, when the pulsed laser light is emitted from the light source, the synchronization signal output from the light source is input to the phase locked loop portion. In the phase locked loop portion, by means of the phase locked loop employing the synchronization signal, the clock generating portion generates the clock that has a frequency that is N-times the pulse frequency of the laser light and that is synchronized to the phase of the laser light, and the delay adjusting portion adjusts the delay amount of the generated clock, thus generating the sampling clock.

The generated sampling clock is used in the A/D converting portion to perform sampling of the signal light coming from the sample, and, in the received-data processing portion, every time N items of sampling data output from the A/D converting portion are continuously acquired, the N items of the data are accommodated in a single data sequence.

Because the signal light is sampled by using the sampling clock having the frequency that is N-times the synchronization signal of the laser light, the time cycle in which N items of the sampling data are acquired and the pulsed oscillation cycle of the laser light completely coincide with each other. By doing so, it is possible to acquire the sampling data without loss and without causing dead time to occur at the boundaries in the pulsed oscillation cycle of the laser light.

Because the phase between the pulsed oscillation cycle of the laser light and the sampling clock is locked, it is possible to perform sampling in the individual pulsed oscillation cycles at the same timing every time. By doing so, it is possible to maintain a high time precision between pulsed irradiation and sampling even if the sampling frequency is reduced, and thus, it is possible to use a low-cost A/D converter.

In the above-described aspect, the delay amount may be set so that sampling is performed at a position at which a level of the signal light to be detected reaches a maximum.

By doing so, it is possible to precisely detect the shape of the signal light that gradually attenuate after reaching a peak intensity, as with the signal light output from the sample, such as fluorescence, or the like.

In the above-described aspect, the received-data processing portion may be provided with a sequencing-start-trigger generating portion that is configured so as to generate a sequencing start trigger that indicates from which one of the sampling data among the sampling data that are successively output from the A/D converting portion sequencing of the data will be started.

By doing so, the sequencing-start-trigger generating portion generates the sequencing start trigger with it is determined which from which one of the sampling data the data sequencing will be started. By doing so, it is possible to set the sequencing start trigger on the basis of the delay amounts including various delays that occur between the time when the laser light emitted from the light source and the time when sampling thereof is performed in the A/D converting portion, and it is possible to precisely detect the signal light generated every time the laser light is radiated onto the sample in a pulsed manner by partitioning the signal light into separate pulsed irradiation cycles.

In the above-described aspect, the sequencing-start-trigger generating portion may determine the timing of the sequencing start trigger by converting, to the number of sampling clocks, a delay difference between the time when the synchronization signal is output and the time when the laser light is transmitted to the A/D converting portion in the form of an analog signal after being reflected by the sample.

By doing so, it is possible to generate the sequencing start trigger at a time point that is delayed from the synchronization signal by an amount corresponding to the delay difference that is converted to the number of the sampling clocks generated in synchronization with the synchronization signal, and it is possible to precisely detect the signal light corresponding to the laser light.

Another aspect of the present invention provides a laser-scanning microscope including: a scanning portion that is configured so as to two-dimensionally scan the laser light coming from the light source; an optical system that is configured so as to radiate the laser light scanned by the scanning portion onto the sample and that focuses the signal light generated in the sample; and any one of the above-described light detecting apparatuses that is configured so as to detect the signal light focused by the optical system.

REFERENCE SIGNS LIST 1 laser-scanning microscope
2 light source
4 light detecting apparatus
8 scanner (scanning portion)
9 objective lens (optical system)
12 PLL portion (phase locked loop portion)
13 A/D converter (A/D converting portion)
14 clock generating portion
15 delay adjusting portion
16 received-data processing portion
18 sequencing-start-trigger generating portion
X sample

The invention claimed is:
1. A light detecting apparatus comprising:
a light source that is configured to emit pulsed laser light and to output a synchronization signal synchronized with the laser light;
a phase locked loop portion that is configured to receive input of the synchronization signal output by the light source and to generate a sampling clock based on the synchronization signal;
an A/D converting portion that is configured to perform sampling of signal light output from a sample as a result of radiating the laser light thereon, in accordance with the sampling clock output from the phase locked loop portion; and
a received-data processing portion that is configured to accommodate, every time N (where N is an integer that is equal to or greater than 2) items of the sampling data output from the A/D converting portion are continuously acquired, the N items of the data in a single data sequence,
wherein the phase locked loop portion comprises:
a clock generating portion that generates, based on a phase locked loop, a clock that has a frequency that is N times a pulse frequency of the laser light and that is synchronized with a phase of the synchronization signal; and
a delay adjusting portion that is configured to (i) set a first delay amount, and (ii) generate the sampling clock by delaying the clock generated by the clock generating portion by an amount corresponding to the first delay amount, and
wherein the received-data processing portion comprises a sequencing-start-trigger generating portion that is con- figured to (i) set a second delay amount for determining from which one of the sampling data, from among the sampling data that are successively output from the A/D converting portion, sequencing of the data will be started, and (ii) generate a sequencing start trigger at a timing that is delayed by an amount corresponding to the second delay amount.

2. The light detecting apparatus according to claim 1, wherein the delay adjusting portion sets the first delay amount so that sampling is performed at a position at which a level of the signal light to be detected reaches a maximum.

3. The light detecting apparatus according to claim 1, wherein the sequencing-start-trigger generating portion determines the timing of the sequencing start trigger by converting, to the number of sampling clocks, a delay difference between the time when the synchronization signal is output and the time when the laser light is transmitted to the A/D converting portion in the form of an analog signal after being reflected by the sample.

4. A laser-scanning microscope comprising:
the light detecting apparatus according to claim 1;
a scanning portion that is configured to two-dimensionally scan the laser light coming from the light source; and
an optical system that is configured to radiate the laser light scanned by the scanning portion onto the sample and that focuses the signal light generated in the sample,
wherein the light detecting apparatus is configured to detect the signal light focused by the optical system.

5. The light detecting apparatus according to claim 1, wherein the received-data processing portion further performs data processing of extracting, from plural single data sequences sequentially sequenced by the received-data processing portion and respectively corresponding to individual pulses of the laser light, sampling data detected in specific time segments after the individual pulses of the laser light.

6. The light detecting apparatus according to claim 1, further comprising a pixel-data generating portion that starts pixel-data generation at a timing that is delayed by an amount corresponding to a third delay amount set to a data-sampling delay adjusting value with respect to a scanning start timing of a pixel clock.

7. The light detecting apparatus according to claim 5, wherein the received-data processing portion further performs two-dimensional sequence processing in which sequenced data having been sequentially sequenced by the received-data processing portion are used as column elements, and N data sequences respectively corresponding to individual pulses of the laser light are successively accommodated in the row direction.

8. The light detecting apparatus according to claim 1, further comprising a phase locked loop lock monitoring portion configured to receive a phase locked loop lock signal from the phase locked loop portion, and to output a scanning stop signal in a case in which synchronization with the synchronization signal received from the synchronization-signal outputting portion is lost.

* * * * *